United States Patent
Kim et al.

(10) Patent No.: US 9,531,402 B1
(45) Date of Patent: Dec. 27, 2016

(54) DELTA-SIGMA ANALOG-DIGITAL CONVERTER AND METHOD

(71) Applicant: SAMSUNG ELECTRO-MECHANICS CO., LTD., Suwon-si (KR)

(72) Inventors: Dong Hyun Kim, Suwon-si (KR); Sang Hoon Hwang, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days.

(21) Appl. No.: 15/131,423

(22) Filed: Apr. 18, 2016

(30) Foreign Application Priority Data

Aug. 5, 2015 (KR) ........................ 10-2015-0110597

(51) Int. Cl.
 *H03M 3/00* (2006.01)
(52) U.S. Cl.
 CPC ............ *H03M 3/422* (2013.01); *H03M 3/322* (2013.01); *H03M 3/436* (2013.01); *H03M 3/464* (2013.01)
(58) Field of Classification Search
 CPC ........ H03M 3/30; H03M 3/50; H03M 7/3004; H03M 3/422; H03M 3/322; H03M 3/436; H03M 3/464; H03M 3/424; H03M 7/3028; H03M 1/46
 USPC ................................................. 341/155, 143
 See application file for complete search history.

(56) References Cited

U.S. PATENT DOCUMENTS

| | | | | |
|---|---|---|---|---|
| 6,738,004 B2 * | 5/2004 | Melanson | ............ | H03M 3/338 341/143 |
| 7,212,874 B2 * | 5/2007 | Melanson | ............ | H03B 29/00 341/143 |
| 7,436,338 B2 * | 10/2008 | Hales | ................... | H03M 3/464 341/143 |
| 8,896,471 B1 * | 11/2014 | Pagnanelli | ..................... | 341/143 |
| 2004/0032355 A1 * | 2/2004 | Melanson | ............ | H03M 3/338 341/143 |
| 2004/0190728 A1 * | 9/2004 | Melanson | ............ | H03B 29/00 381/71.8 |
| 2013/0194114 A1 * | 8/2013 | Ritter | ................... | H03M 3/368 341/110 |

FOREIGN PATENT DOCUMENTS

| | | |
|---|---|---|
| JP | 2007-300225 A | 11/2007 |
| KR | 10-2009-0114706 A | 11/2009 |

* cited by examiner

*Primary Examiner* — Jean B Jeanglaude
(74) *Attorney, Agent, or Firm* — NSIP Law

(57) ABSTRACT

A delta-sigma analog-digital converter and method to generate a digital output signal from an analog input signal are provided. A delta-sigma analog-digital converter includes a loop input signal generating unit configured to generate a loop input signal based on both the analog input signal and a feedback signal that is based on the digital output signal, a noise shaping unit including a plurality of feedback loop stages that respectively filter fed back local error signals that are respectively based on the digital output signal, to generate a loop output signal with reduced noise over the loop input signal, and a quantizing unit configured to quantize the loop output signal and to generate the digital output signal based on the quantized loop output signal.

20 Claims, 6 Drawing Sheets

DELTA-SIGMA ANALOG-DIGITAL CONVERTER AND METHOD

CROSS-REFERENCE TO RELATED APPLICATION

This application claims the benefit under 35 USC 119(a) of Korean Patent Application No. 10-2015-0110597 filed on Aug. 5, 2015, in the Korean Intellectual Property Office, the entire disclosures of which are incorporated herein by reference for all purposes.

BACKGROUND

1. Field

The present disclosure relates to a delta-sigma analog-digital converter and method.

2. Description of Related Art

In the field of mobile communications and network systems, products designed to more precisely and accurately process image and voice signals have been used.

Single elements having various functions, such as a system on chip (SoC) or the interface technology between an analog signal and a digital signal in the SoC, may be used for such image and/or voice signal processing.

A delta-sigma analog-digital converter (ΔΣADC) is an ADC which is used in accordance with the development of semiconductor technology. Since the delta-sigma ADC may provide negative feedback for an error generated during a process in which the analog signal is converted into the digital signal, as an input of a system to perform noise shaping, the delta-sigma ADC may output a digital signal having high resolution corresponding to an input signal.

A delta-sigma ADC including an analog filter, provided by an amplifier, a switch, and a capacitor, may result in distorted noise shaping and have distorted signal transfer characteristics, depending on the non-ideal characteristics of the respective elements of the analog filter, as only an example.

SUMMARY

This Summary is provided to introduce a selection of concepts in a simplified form that are further described below in the Detailed Description. This Summary is not intended to identify key features or essential features of the claimed subject matter, nor is the Summary intended to be used as an aid in determining the scope of the claimed subject matter.

One or more embodiments provide a delta-sigma analog-digital converter to generate a digital output signal from an analog input signal, including a loop input signal generating unit configured to generate a loop input signal based on both the analog input signal and a feedback signal that is based on the digital signal, a noise shaping unit including a plurality of feedback loop stages that respectively filter fed back local error signals that are respectively based on the digital output signal, to generate a loop output signal with reduced noise over the loop input signal, and a quantizing unit configured to quantize the loop output signal and to generate the digital output signal based on the quantized loop output signal.

The loop input signal generating unit may be configured to generate the loop input signal by quantizing a result of an analysis based on the analog input signal and the feedback signal.

The analysis based on the analog input signal and the feedback signal may include performing a summation with regard to the analog input signal and an analog signal based on the feedback signal.

The plurality of feedback loop stages may include a first loop unit through an m-th loop unit, where m is a natural number of two or more, the first loop unit through the m-th loop unit being connected in series so a previous loop unit resultant loop signal is provided to a subsequent loop unit, and each of the first loop unit through the m-th loop unit may perform the respective filtering of the fed back local error signals, and a filtered fed back local error signal of the m-th loop may be provided to the loop input signal generating unit for the feedback signal.

Each of the first loop unit through the m-th loop unit may extract the local error signals by respectively obtaining a difference between the digital output signal and a corresponding resultant loop signal of each of the first loop unit through the m-th loop unit.

Each of the first loop unit through the m-th loop unit may include a loop filter that performs the respective filtering of the fed back local error signals, and each of the first loop unit to (m−1)-th loop unit, or the first loop unit when m equals 2, may generate a resultant loop signal by summing a result of the respective filtering and a corresponding previous loop unit provided loop signal.

Each of the loop filters may be a digital finite impulse response filter including a plurality of digital delay elements, a plurality of digital multiplexers, and a plurality of digital adders.

The loop input signal generating unit may include a digital-analog converter configured to perform a digital to analog conversion of the filtered fed back local error signal of the m-th loop, an adder adding a result of the digital to analog conversion to the analog input signal, and an analog quantizer configured to quantize a result of the adding to generate the loop input signal.

Each of the first loop unit through the m-th loop unit may include a subtractor configured to extract a corresponding local error signal by obtaining a difference between a resultant loop signal of a corresponding loop unit and the digital output signal, and a loop filter filtering the corresponding local error, and each of the first loop unit to the (m−1)-th loop unit, or the first loop unit when m equals 2, may further include an adder configured to sum a result of the filtering of the corresponding local error and a corresponding previous loop unit provided loop signal, to generate the resultant loop signal of the corresponding loop unit.

The plurality of feedback loop stages may include a first loop unit through an m-th loop unit, where m is a natural number of two or more, the first loop unit through the m-th loop unit being connected in series so a previous loop unit generated loop signal is provided to a subsequent loop unit, and each of the first loop unit through the m-th loop unit may perform the respective filtering of the fed back local error signals, and the digital output signal may be provided to the loop input signal generating unit for the feedback signal.

Each of the first loop unit through the m-th loop unit may extract the local error signals by respectively obtaining a difference between a resultant loop signal of each of the first loop unit through the m-th loop unit and the digital output signal.

Each of the first loop unit through the m-th loop unit may include a loop filter that performs the respective filtering of the fed back local error signals, and each of the first loop unit to (m−1)-th loop unit may generate a resultant loop signal by summing a result of the respective filtering and a corresponding previous loop unit provided loop signal, and the m-th loop unit may generate a corresponding resultant loop signal by summing a result of the respective filtering and the input loop signal.

Each of the loop filters may be a digital finite impulse response filter including a plurality of digital delay elements, a plurality of digital multiplexers, and a plurality of digital adders.

The loop input signal generating unit may include a digital-analog converter configured to perform a digital to analog conversion of the digital output signal to generate the feedback signal, an analyzer configured to analyze the feedback signal and the analog input signal, and an analog quantizer configured to quantize a result of the analyzing to generate the loop input signal.

The analyzing of the feedback signal and the analog input signal may include performing a summation with regard to the analog input signal and an analog signal based on the feedback signal.

Each of the first loop unit to the m-th loop unit may include a subtractor configured to extract a corresponding local error signal by obtaining a difference between a resultant loop signal of a corresponding loop unit and the digital output signal, a loop filter filtering the corresponding local error signal, and an adder configured to sum a result of the filtering of the corresponding local error and a corresponding previous loop unit provided loop signal, to generate the resultant loop signal of the corresponding loop unit.

One or more embodiments provide a delta-sigma analog-digital conversion method for generating a digital output signal from an analog input signal, the method including generating a loop input signal based on both the analog input signal and a feedback signal that is based on the digital output signal, performing plural feedback loop operations that each include filtering of respective fed back local error signals that are respectively based on the digital output signal, to generate a loop output signal from the loop input signal with reduced noise over the loop input signal, and quantizing the loop output signal to generate the digital output signal.

One of the plural feedback loop operations may include determining a difference between the digital output signal and the loop input signal, and the method may further include generating the analog feedback signal by digital to analog converting a result of a filtering of the determined difference.

Another one of the plural feedback loop operations may include summing a loop output signal of a previous one of the plural feedback loop operations and a result of the filtering of the respective fed back local error signal.

One of the plural feedback loop operations may include determining a difference between the digital output signal and a resultant loop signal generated by the one feedback loop operation, and the method may further include generating the analog feedback signal by digital to analog converting the digital output signal.

Additional and/or alternative aspects will be set forth in part in the description which follows and, in part, will be apparent from the description, or may be learned by practice of the presented embodiments.

Figure 1:
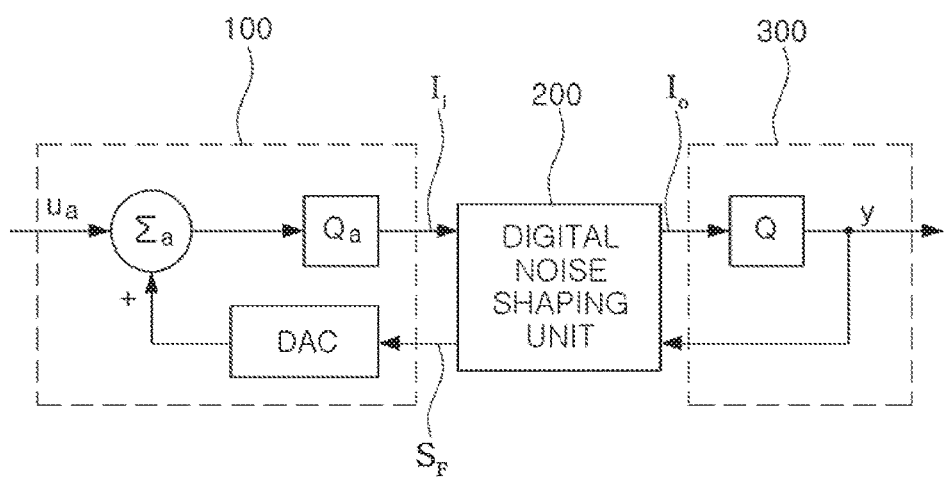
FIG. 1 is a block diagram schematically illustrating an example of a delta-sigma analog-digital converter.

The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, after an understanding of the present disclosure, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order, after an understanding of the present disclosure. Also, descriptions of functions and constructions that may be understood, after an understanding of differing aspects of the present disclosure, may be omitted in some descriptions for increased clarity and conciseness.

The features and aspects described herein may be embodied in many different forms and should not be construed as being limited to the specific embodiments set forth herein. Rather, these embodiments are provided so that this disclosure will be thorough and complete, and will convey a scope of the disclosure to those skilled in the art.

Various alterations and modifications may be made to embodiments, some of which will be illustrated in detail in the drawings and detailed description. However, it should be understood that these embodiments are not construed as limited to the disclosure and illustrated forms and should be understood to include all changes, equivalents, and alternatives within the idea and the technical scope of this disclosure.

As used herein, the singular forms "a," "an," and "the" are intended to include the plural forms as well, unless the context clearly indicates otherwise. It will be further understood that the terms "have", "having", "includes", "including", "comprises," and/or "comprising" when used in this specification, specify the presence of stated features, integers, operations, members, elements, and/or groups thereof, but do not preclude the presence or addition of one or more other features, integers, operations, members, elements, and/or groups thereof. In addition, though terms such as first, second, A, B, (a), (b), and the like may be used herein to describe various members, components, and/or sections, unless indicated otherwise, these terminologies are not used to define an essence, order, or sequence of a corresponding member, component, and/or section but used merely to distinguish the corresponding member, component, and/or section from other member(s), component(s), and/or section(s). For example, a first member, component, or section discussed below could be termed a second member, component, or section without departing from the teachings of the embodiments.

Hereinafter, one or more embodiments are described with reference to schematic views illustrating characteristics, features, concepts, or aspects of the corresponding embodiments. In the drawings, for example, due to manufacturing techniques and/or tolerances, modifications of the shape shown may be expected. Thus, embodiments of the present disclosure should not be construed as being limited to the particular forms, shapes, or configurations of such members, components, or sections shown herein, for example, but such embodiments should be understood to include alternative forms, shapes, or configurations depending on manufacturing process, availability, or design. In addition, though differing embodiments may be demonstrated, such embodiments may be collectively embodied as a single embodiment having characteristics, features, concepts, or aspects of multiple or all the described embodiments. Still further, herein, any referred to apparatuses, systems, modules, or units are hardware elements.

FIG. 1 is a block diagram schematically illustrating a delta-sigma analog-digital converter, according to one or more embodiments.

Referring to FIG. 1, the delta-sigma analog-digital converter includes an input unit 100, a noise shaping unit 200, and an output unit 300, for example.

The input unit 100 may output a loop input signal $l_i$ in response to a feedback signal $S_f$ and an analog input signal $u_a$. Specifically, the input unit 100 may receive the feedback signal $S_f$ from the noise shaping unit 200 to perform a conversion of the feedback signal St into an analog signal and may respectively add and subtract the analog converted signal to and from the analog input signal $u_a$ to generate the loop input signal $l_i$.

Here, the loop input signal $l_i$ may be a signal quantized by a quantizer $Q_a$, for example, of the input unit 100 that is then directed to the digital noise shaping unit 200.

The noise shaping unit 200 may receive the loop input signal $l_i$, may provide or direct the feedback signal $S_f$ to the input unit 100, may filter and feedback a local error signal extracted based on a fed back digital output signal y across a plurality of stages, and may generate a loop output signal $l_o$ in which noise of the loop input signal is reduced, using the filtered local error signal. A more detailed description of such a noise shaping unit 200 will be provided with reference to FIGS. 2 and 3.

The output unit 300 may include the quantizer Q that quantizes the loop output signal $l_o$, for example, and outputs the digital output signal y. The output unit 300 may also implement the feedback of the digital output signal y to the noise shaping unit 200, as discussed above.

Here, in an embodiment, the noise shaping unit 200 may have an analog quantizer $Q_a$ and the quantizer Q connected to both terminals thereof, or at least an output of the quantizer $Q_a$ is provided or directed to the noise shaping unit 200 and an output of the noise shaping unit 200 is provided or directed to the quantizer Q. Thus, since the noise shaping unit 200 may process a digital signal, or only a digital signal, it may reduce distortion in the noise shaping and signal transfer characteristics that may result from non-ideal characteristics of analog elements of the analog-digital converter.

Figure 2:
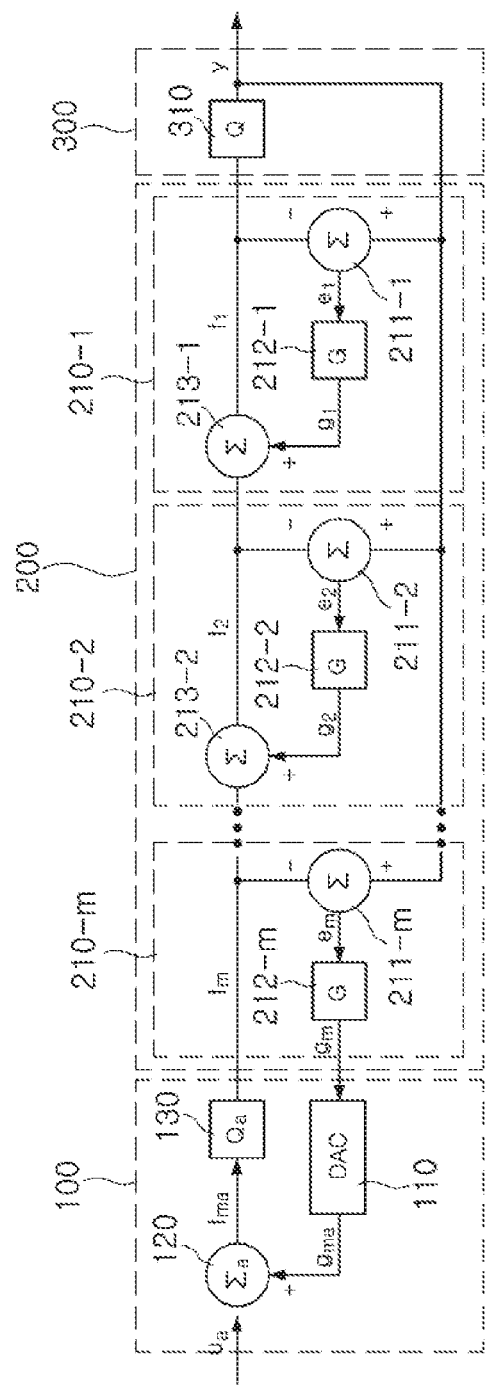
FIG. 2 is a block diagram illustrating an example of a delta-sigma analog-digital converter.

FIG. 2 is a block diagram illustrating a delta-sigma analog-digital converter, according to one or more embodiments.

Referring to FIG. 2, the delta-sigma analog-digital converter includes an input unit 100, a noise shaping unit 200, and an output unit 300, for example. Here, the input unit 100, noise shaping unit 200, and output unit 300 of FIG. 1 may be the same as the input unit 100, noise shaping unit 200, and output 300 of FIG. 2, though embodiments are not limited thereto.

The input unit 100 may output the loop input signal $l_i$, as discussed above, that is obtained by quantizing a signal generated by adding the analog input signal $u_a$ to an analog signal $g_{ma}$ obtained by performing a digital to analog conversion of an m-th filter output $g_m$.

To this end, the input unit 100 may include a digital-analog converter 110, an adder 120, and an analog quantizer 130, for example. The digital-analog converter 110 may output the analog signal $g_{ma}$ generated based on the m-th filter output digital signal $g_m$, and the adder 120 may add and output the analog signal $g_{ma}$ to the analog input signal $u_a$. Further, the analog quantizer 130 may quantize the result of the adder 120 and may output the loop input signal $l_i$ to the noise shaping unit 200.

The noise shaping unit 200 may include multiple loop units, such as a first loop unit 210-1 through an m-th loop unit 210-m (where m is a natural number of two or more) connected to each other in series, where each of the first loop unit to the m-th loop unit 210-1 to 210-m may respectively filter local error signals $e_1$ to $e_m$ to respectively generate the filtered output $g_1$ to $g_m$ signals, and may respectively use the fed back $g_1$ to $g_{m-1}$ signals to generate resultant loop signals of the first loop unit 210-1 through the (m−1)-th loop unit 210-(m−1). The noise shaping unit 200 may provide or direct the m-th filter output $g_m$ to the input unit 100 as the aforementioned feedback signal $S_f$.

Specifically, each of the first to m-th loop units 210-1 to 210-m may extract respective local error signals $e_1$ to $e_m$ by subtracting respectively generated $f_1$ to $f_m$ signals by the first to m-th loop units 210-1 to 210-m from the digital signal y resulting from operations of the output unit 300, and may input the respective local error signals $e_1$ to $e_m$ to loop filters 212-1 to 212-m.

In addition, each of the first to (m−1)-th loop units 210-1 to 210-(m−1) may add and output or provide the filter outputs $g_1$ to $g_{m-1}$ respectively generated by the loop filter 212-1 to 212-(m−1) to the output or result of a loop unit of a previous stage, with the m-th loop unit 210-m providing the m-th filter output $g_m$ to the input unit 100. Here, as only an example, the loop unit 210-2 would be considered an immediate previous stage of the first loop unit 210-1. In addition, the first loop unit 210-1 would be considered a subsequent stage of the loop unit 210-2, both of which would be subsequent to the m-th loop unit 210-m.

In addition, as noted above, the m-th loop unit 210-m may receive the resultant quantized loop input signal $l_i$ generated by the input unit 100.

To this end, each of the first to m-th loop units 210-1 to 210-m may include subtractors, or subtracting adders, 211-1 to 211-m and the loop filters 212-1 to 212-m, with each of the first to (m−1)-th loop units 210-1 to 210-(m−1) including adders, or subtracting adders, 213-1 to 213-(m−1), for example.

The subtractors 211-1 to 211-m may respectively output the corresponding local error signals $e_1$ to $e_m$ by subtracting the respectively generated $f_1$ to $f_m$ signals by the first to m-th loop units 210-1 to 210-m from the digital output signal y, and the loop filters 212-1 to 212-m may generate the first to m-th filter outputs $g_1$ to $g_m$ by filtering the corresponding local error signals $e_1$ to $e_m$. In addition, the adders 213-1 to 213-(m−1) may add the first to (m−1)-th filter outputs $g_1$ to $g_{m-1}$ to the inputs of the same respective loop units.

Since a configuration and an operation of the output unit 300 may be similar or the same as in the delta-sigma analog-digital converter of FIG. 1, according to one or more embodiments, further detailed description thereof will be omitted here.

Figure 3:
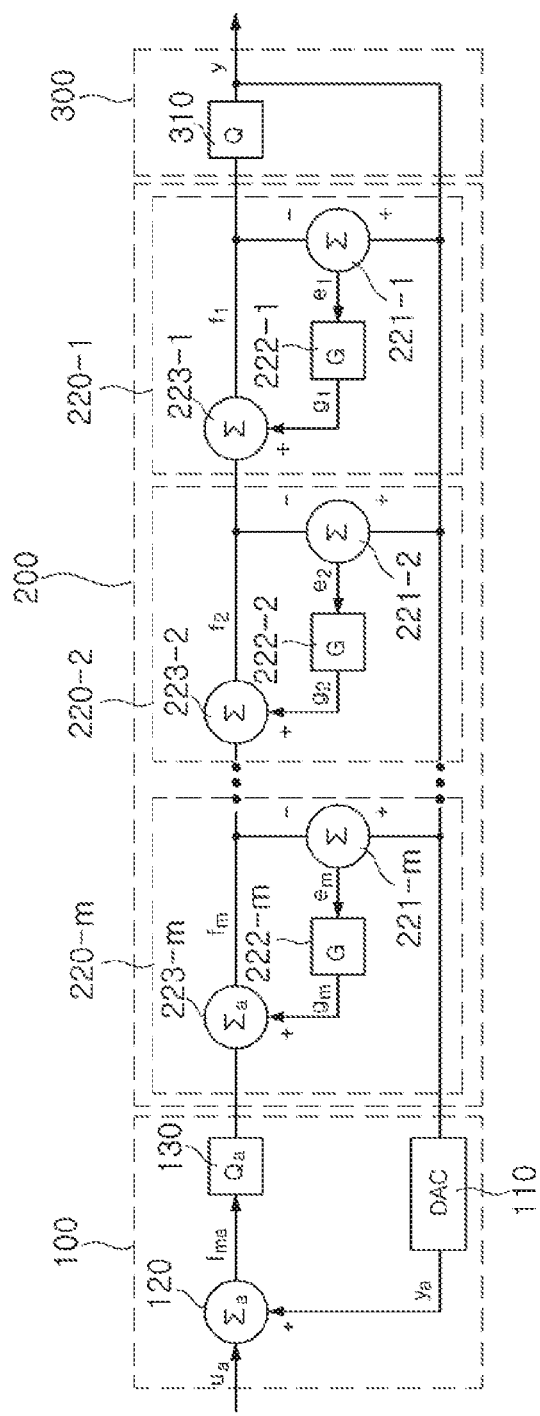
FIG. 3 is a block diagram illustrating an example of a delta-sigma analog-digital converter.

FIG. 3 is a block diagram illustrating a delta-sigma analog-digital converter, according to one or more embodiments.

Referring to FIG. 3, the delta-sigma analog-digital converter includes an input unit 100, a noise shaping unit 200, and an output unit 300, for example. Here, the input unit 100, noise shaping unit 200, and output unit 300 of FIG. 1 may be the same as the input unit 100, noise shaping unit 200, and output unit 300 of FIG. 3, though embodiments are not limited thereto.

The input unit 100 may output the loop input signal $l_i$ obtained by quantizing a signal generated by adding the analog input signal $u_a$ to an analog signal $y_a$ obtained by performing a digital to analog conversion of the digital output signal y resulting from the operations of the output unit 300.

To this end, the input unit 100 may include a digital-analog converter 110, an adder 120, and an analog quantizer 130, which may operate similarly to the digital-analog converter 110, adder 120, and analog quantizer 130 of FIG. 2, though embodiments are not limited thereto. The digital-analog converter 110 may output the analog signal $y_a$ generated based on the digital output signal y, and the adder 120 may add the analog signal $y_a$ to the analog input signal $u_a$. Further, the analog quantizer 130 may quantize a result of the adder 120, e.g., the result of adding the analog signal $y_a$ to the analog input signal $u_a$, and may generate the aforementioned loop input signal $l_i$ to be provided to the noise shaping unit 200.

The noise shaping unit 200 may include a first loop unit to an m-th loop unit 220-1 to 220-m (where m is a natural number of two or more) connected to each other in series, where each of the first loop unit to the m-th loop unit 220-1 to 220-m may respectively filter local error signals $e_1$ to $e_m$ to respectively provide a feedback signal, from a first filter output to an m-th filter output $g_1$ to $g_m$, and may provide the digital output signal y resulting from the output unit 300 to the input unit 100 as the aforementioned feedback signal $S_f$.

Specifically, each of the first to m-th loop units 220-1 to 220-m may respectively extract the local error signals $e_1$ to $e_m$ by subtracting respectively generated $f_1$ to $f_m$ signals by the first to Mth loop units 220-1 to 220-m from the digital output signal y resulting from operations of the output unit 300, and may input the respective local error signals $e_1$ to $e_m$ to loop filters 222-1 to 222-m.

In addition, each of the first to m-th loop units 220-1 to 220-m may add and output or provide the filter outputs $g_1$ to $g_m$ respectively generated by the loop filters 222-1 to 222-m to the output or result of a loop unit of a previous stage or the input loop signal for the m-th loop unit. Similar to the discussion above with regard to FIG. 2, and as only an example, the loop unit 220-2 would be considered an immediate previous stage of the first loop unit 220-1. In addition, the first loop unit 220-1 would be considered a subsequent stage of the loop unit 220-2, both of which would be subsequent to the m-th loop unit 220-m.

In addition, as noted above, the m-th loop unit 220-m may receive the resultant quantized loop input signal $l_i$ generated by the input unit 100.

To this end, each of the first to m-th loop units 220-1 to 220-m may include subtractors, or subtracting adders, 221-1 to 221-m, the loop filters 222-1 to 222-m, and adders 223-1 to 223-m.

The subtractors 221-1 to 221-m may respectively output the corresponding local error signals $e_1$ to $e_m$ by subtracting the respectively generated $f_1$ to $f_m$ signals by the first to m-th loop units 220-1 to 220-m from the digital output signal y, and the loop filters 222-1 to 222-m may generate the first to m-th filter outputs $g_1$ to $g_m$ by filtering the corresponding local error signals $e_1$ to $e_m$. In addition, the adders 223-1 to 223-m may add the first to m-th filter outputs $g_1$ to $g_m$ to the inputs of the same respective loop units.

Since a configuration and an operation of the output unit 300 may be similar or the same as in the delta-sigma analog-digital converter of FIG. 1, according to one or more embodiments, further detailed description thereof will be omitted here.

Figure 4:
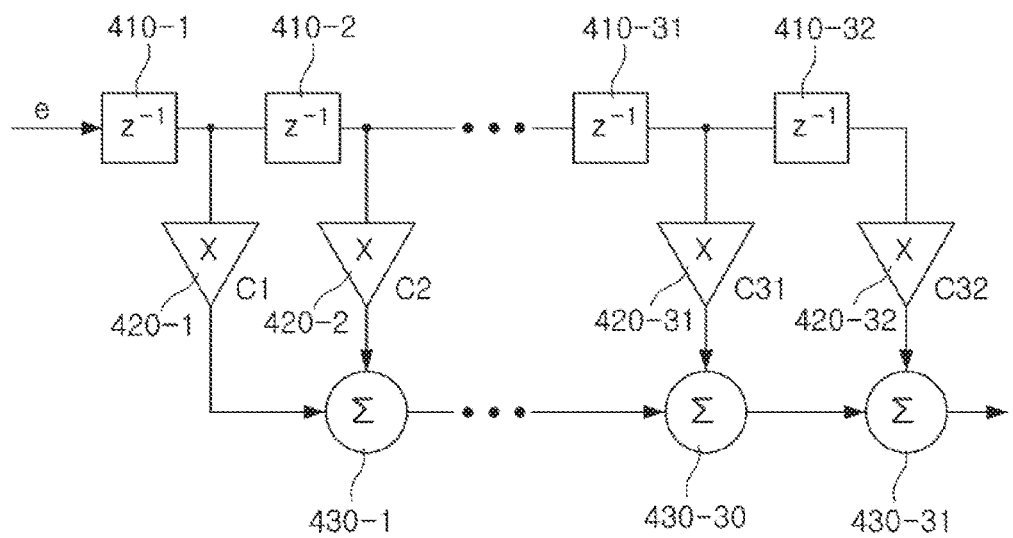
FIG. 4 is a block diagram of a loop filter of a delta-sigma analog-digital converter.

FIG. 4 is a block diagram of a loop filter of a delta-sigma analog-digital converter, according to one or more embodiments.

Referring to FIG. 4, a loop filter, such as any of the loop filters 212-1 to 212-m of FIG. 2 or any of the loop filters 222-1 to 222-m of FIG. 3, for example, may include a plurality of digital delay elements 410-1 to 410-32, e.g., for an example total of 32 digital delay elements, a plurality of digital multiplexers 420-1 to 420-32, e.g., for an example total of 32 digital multiplexers, and a plurality of digital adders 430-1 to 430-31, e.g., for an example total of 31 digital delay elements. Thus, in one or more embodiments, the loop filter may be a digital finite impulse response (FIR) filter having thirty-two taps, for example. Alternatively, there may be a total of n digital delay elements, n digital multiplexers, and n−1 digital adders, with n being a natural number of 2 or more.

With the example illustrated in FIG. 4, a z-transformation differential equation G(z) of the loop filter may be expressed by the below Equation 1, for example.

$$G(z) = c_1 \cdot z^{-1} + c_2 \cdot z^{-2} \ldots + c_{31} \cdot z^{-31} + c_{32} \cdot z^{-32} \qquad \text{Equation 1}$$

Here, state coefficients $c_1$ to $c_{32}$ of the example digital FIR filter may be predetermined. For example, the state coefficients may be based on characteristics of a modeled filter in consideration of elements of the corresponding loop unit, multiple loop units, and/or the analog to digital converter as a whole. For example, the coefficients $C_1$ to $C_{32}$ may be set according to the below Table 1, which have been set to merely provide a non-limiting example comparison between frequency characteristics and a signal to quantized noise ratio, noting that alternatives are available. Thus, the coefficients of Table 1 are only example coefficients and should not limit a scope of the present disclosure.

TABLE 1

| | |
|---|---|
| $C_1$ | −0.4024 |
| $C_2$ | −0.3133 |
| $C_3$ | −0.2336 |
| $C_4$ | −0.1642 |
| $C_5$ | −0.1051 |
| $C_6$ | −0.0564 |
| $C_7$ | −0.0177 |
| $C_8$ | 0.0118 |
| $C_9$ | 0.0329 |
| $C_{10}$ | 0.0465 |
| $C_{11}$ | 0.0538 |
| $C_{12}$ | 0.0557 |
| $C_{13}$ | 0.0536 |
| $C_{14}$ | 0.0483 |
| $C_{15}$ | 0.0408 |

TABLE 1-continued

| | |
|---|---|
| $C_{16}$ | 0.0322 |
| $C_{17}$ | 0.0230 |
| $C_{18}$ | 0.0141 |
| $C_{19}$ | 0.0059 |
| $C_{20}$ | −0.0012 |
| $C_{21}$ | −0.0069 |
| $C_{22}$ | −0.0110 |
| $C_{23}$ | −0.0136 |
| $C_{24}$ | −0.0148 |
| $C_{25}$ | −0.0146 |
| $C_{26}$ | −0.0133 |
| $C_{27}$ | −0.0113 |
| $C_{28}$ | −0.0008 |
| $C_{29}$ | −0.0063 |
| $C_{30}$ | −0.0039 |
| $C_{31}$ | −0.0020 |
| $C_{32}$ | −0.0007 |

Figure 5:
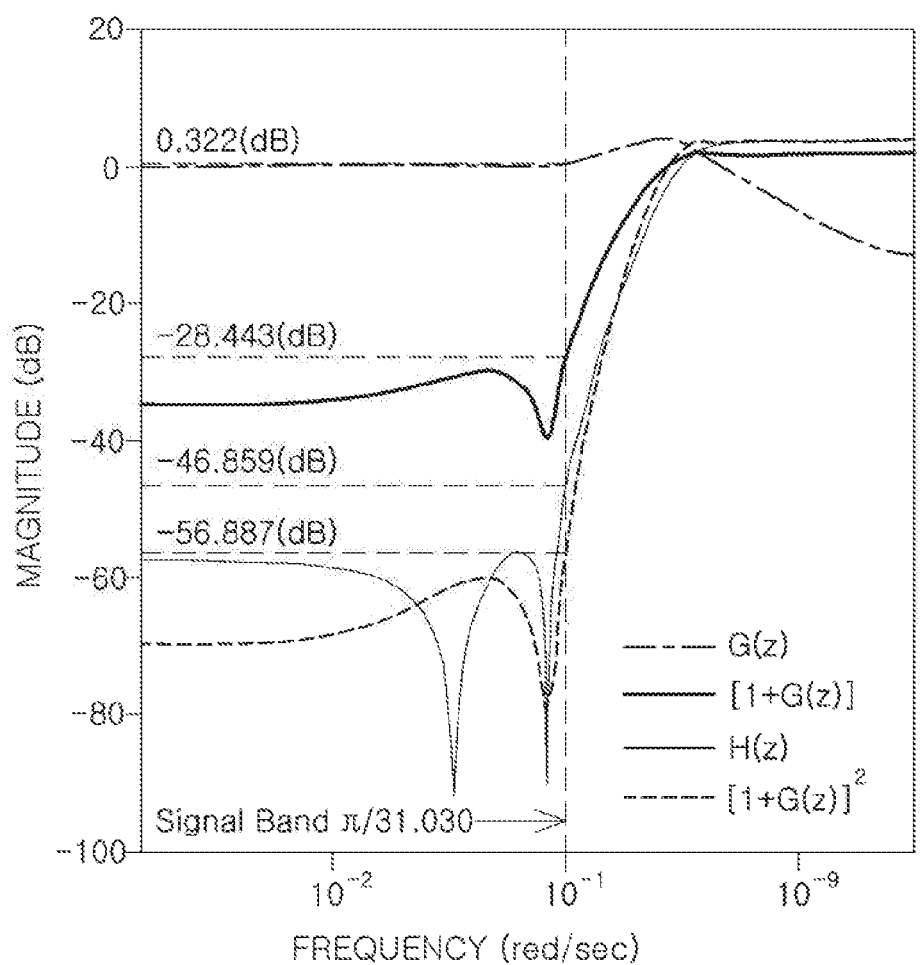
FIG. 5 is a graph illustrating frequency characteristics of an example delta-sigma analog-digital converter.
Figure 6:
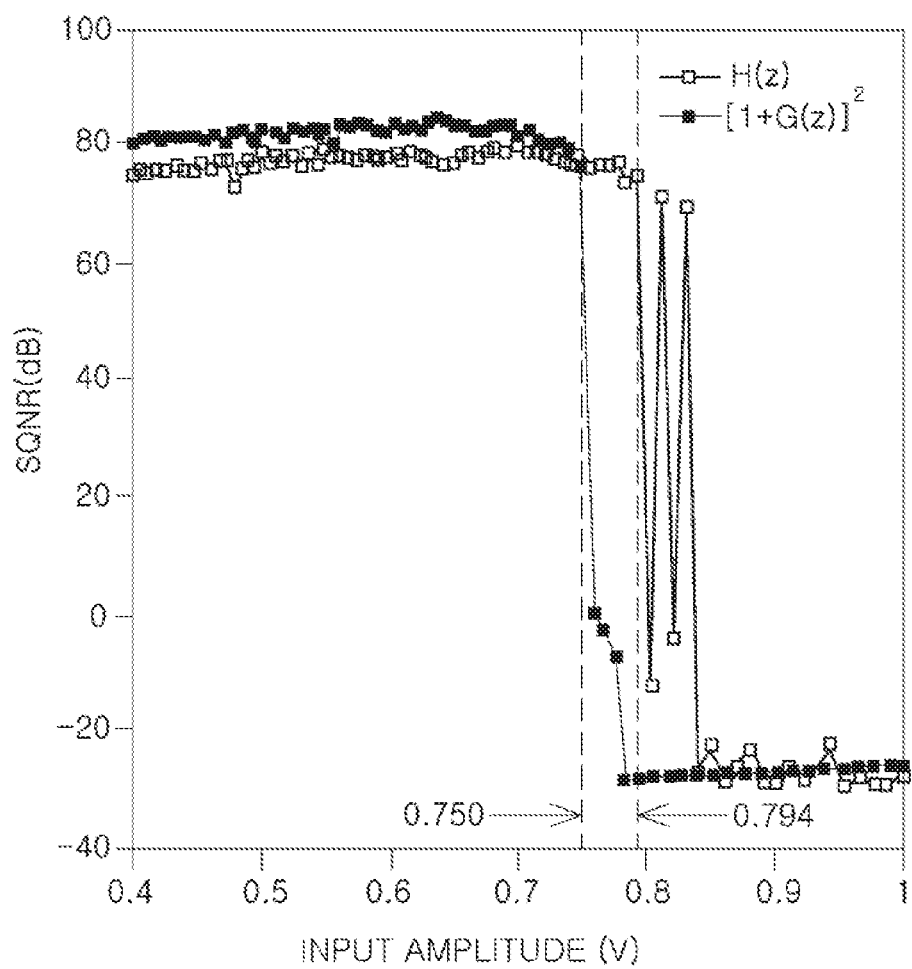
FIG. 6 is a graph illustrating a signal to quantized noise ratio of an example delta-sigma analog-digital converter.

FIG. 5 is a graph illustrating frequency characteristics of an example delta-sigma analog-digital converter, according to one or more embodiments, and FIG. 6 is a graph illustrating a signal to quantized noise ratio of an example delta-sigma analog-digital converter, according to one or more embodiments.

With regard to FIGS. 5 and 6, a delta-sigma analog-digital converter according to an embodiment corresponding to a configuration of FIG. 2 and a typical fourth-order analog noise shaping filter were simulated. Here, it was assumed that the corresponding analog converter, adder, and analog quantizer, such as the analog converter 110, the adder 120, and the analog quantizer 130 of FIG. 2, included in the corresponding input unit of the delta-sigma analog-digital converter have a gain of one. With this assumption, this delta-sigma analog-digital converter may be expressed by the below Equation 2, for example.

$$y = u_m + (1+G)^m \cdot e_1 \quad \text{Equation 2}$$
$$= u_a + (1+G)^m \cdot e$$

Here, G corresponds to G(z) of Equation 1, e.g., described with reference to FIG. 4, and m denotes the total number of loop units connected to each other in series.

In addition, a transfer function for the typical fourth-order analog noise shaping filter, as a comparison reference, may be expressed by the below Equation 3.

$$H(z) = \frac{1 - 3.992z^{-1} + 5.983z^{-2} - 3.992z^{-3} + z^{-4}}{1 - 3.19z^{-1} + 3.883z^{-2} - 2.129z^{-3} + 0.4426z^{-4}} \quad \text{Equation 3}$$

Referring to FIG. 5, the delta-sigma analog-digital converter according to an embodiment may obtain an additional attenuation of 28 dB when m is 2 (illustrated as corresponding to $[1+G(z)]^2$) as compared to the attenuation obtained when m is 1 (illustrated as corresponding to $[1+G(z)]$). Still further, FIG. 5 demonstrates that the example delta-sigma analog-digital converter according to an embodiment, with m being 2, may also obtain an additional attenuation of 10 dB compared to an attenuation obtained by the typical analog noise shaping filter (illustrated as corresponding to H(z)) is used.

In addition, FIG. 6 demonstrates that the delta-sigma analog-digital converter according to an embodiment, with m being 2, exhibits an excellent result for a noise ratio to the digital output signal y depending on a change in amplitude of the analog input signal $u_a$ in a range of an effective input signal, as compared to the noise ratio of the typical analog noise shaping filter.

Additionally, FIG. 6 demonstrates that an example maximum amplitude of an effective input signal of the delta-sigma analog-digital converter according to an embodiment, with m being 2, and the typical analog noise shaping filter are 0.750 and 0.794, respectively.

As such, according to one or more embodiments, a delta-sigma analog-digital converter and/or conversion method may improve noise suppression performance by feeding back the quantized digital signal to the plurality of loop units connected to each other in series, and may adjust an amount of noise shaping present in a signal band based on the number of loop units used.

In addition to the apparatuses, units, modules, elements, devices, and other components of FIGS. 1-4 being hardware elements, which may respectively implement the methods of FIGS. 1-6, as only examples, the methods of FIGS. 1-6 are implemented by hardware components, including any above discussed example hardware elements that are included in an electronic device embodiment. Examples of hardware components include, as only examples, resistors, capacitors, inductors, power supplies, frequency generators, operational amplifiers, power amplifiers, low-pass filters, high-pass filters, band-pass filters, analog-to-digital converters, digital-to-analog converters, controllers, sensors, generators, memory, drivers, circuitry, and/or any other electronic components known to one of ordinary skill in the art, configured to implement any of the summation, subtraction, quantization, filtering, multiplexing, delaying, or digital to analog conversion discussed above, including a processing device, processor, or computer that may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result, to implement any, any combination, or all of the above methods. In one example, the processing device, processor, or computer includes, or is connected to, one or more memories storing instructions or software that are executed by the processing device, processor, or computer and that may control the processing device, processor, or computer to implement one or more methods described herein. Hardware components implemented by a processing device, processor, or computer may execute instructions or software, such as an operating system (OS) and one or more software applications that run on the OS, to perform or control the operations described herein with respect to FIGS. 1-6, for example. Such hardware components may also access, manipulate, process, create, and store data in response to execution of the instructions or software. For simplicity, the singular term "processing device", "processor", or "computer" may be used in the description of the examples described herein, but in other examples multiple processing devices, processors, or computers are used, or a processing device, processor, or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, remote processing environments, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing. In addition, any connecting lines or connectors shown in the various above referred to apparatus figures are intended to represent example functional relationships and/or physical or logical couplings between the various hardware elements, with many alternative or additional functional relationships, physical connections, or logical connections may be present in a corresponding device embodiment.

Instructions or software to control a processing device, processor, or computer to implement the hardware components and perform the methods as described above may be written as computer programs, code segments, instructions or any combination thereof, for individually or collectively instructing or configuring the processing device, processor, or computer to operate as a machine or special-purpose computer to perform the operations performed by the hardware components and the methods as described above. In one example, the instructions or software include machine code that is directly executed by the processing device, processor, or computer, such as machine code produced by a compiler. In another example, the instructions or software include higher-level code that is executed by the processing device, processor, or computer using an interpreter. Based on the disclosure herein, and after an understanding of the same, programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processing device, processor, or computer to implement the hardware components and the methods described above in FIGS. 1-6, and any associated data, data files, and data structures, are recorded, stored, or fixed in or on one or more non-transitory computer-readable storage media. Examples of a non-transitory computer-readable storage medium include read-only memory (ROM), random-access memory (RAM), dynamic random-access memory (D-RAM), static random-access memory (S-DRAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processing device, processor, or computer so that the processing device, processor, or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processing device, processor, or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A delta-sigma analog-digital converter to generate a digital output signal from an analog input signal, comprising:
    a loop input signal generating unit configured to generate a loop input signal based on both the analog input signal and a feedback signal that is based on the digital output signal;
    a noise shaping unit comprising a plurality of feedback loop stages that respectively filter fed back local error signals that are respectively based on the digital output signal, to generate a loop output signal with reduced noise over the loop input signal; and
    a quantizing unit configured to quantize the loop output signal and to generate the digital output signal based on the quantized loop output signal.

2. The delta-sigma analog-digital converter of claim 1, wherein the loop input signal generating unit is configured to generate the loop input signal by quantizing a result of an analysis based on the analog input signal and the feedback signal.

3. The delta-sigma analog-digital converter of claim 2, wherein the analysis based on the analog input signal and the feedback signal includes performing a summation with regard to the analog input signal and an analog signal based on the feedback signal.

4. The delta-sigma analog-digital converter of claim 1, wherein the plurality of feedback loop stages include a first loop unit through an m-th loop unit, where m is a natural number of two or more, the first loop unit through the m-th loop unit being connected in series so a previous loop unit resultant loop signal is provided to a subsequent loop unit, and
    each of the first loop unit through the m-th loop unit performs the respective filtering of the fed back local error signals, with a filtered fed back local error signal of the m-th loop being provided to the loop input signal generating unit for the feedback signal.

5. The delta-sigma analog-digital converter of claim 4, wherein each of the first loop unit through the m-th loop unit extracts the local error signals by respectively obtaining a difference between the digital output signal and a corresponding resultant loop signal of each of the first loop unit through the m-th loop unit.

6. The delta-sigma analog-digital converter of claim 4, wherein each of the first loop unit through the m-th loop unit includes a loop filter that performs the respective filtering of the fed back local error signals, and
    each of the first loop unit to (m−1)-th loop unit, or the first loop unit when m equals 2, generates a resultant loop signal by summing a result of the respective filtering and a corresponding previous loop unit provided loop signal.

7. The delta-sigma analog-digital converter of claim 6, wherein each of the loop filters is a digital finite impulse response filter including a plurality of digital delay elements, a plurality of digital multiplexers, and a plurality of digital adders.

8. The delta-sigma analog-digital converter of claim 4, wherein the loop input signal generating unit includes:
   a digital-analog converter configured to perform a digital to analog conversion of the filtered fed back local error signal of the m-th loop;
   an adder adding a result of the digital to analog conversion to the analog input signal; and
   an analog quantizer configured to quantize a result of the adding to generate the loop input signal.

9. The delta-sigma analog-digital converter of claim 4, wherein each of the first loop unit through the m-th loop unit includes:
   a subtractor configured to extract a corresponding local error signal by obtaining a difference between a resultant loop signal of a corresponding loop unit and the digital output signal; and
   a loop filter filtering the corresponding local error, and
   wherein each of the first loop unit to the (m−1)-th loop unit, or the first loop unit when m equals 2, further includes an adder configured to sum a result of the filtering of the corresponding local error and a corresponding previous loop unit provided loop signal, to generate the resultant loop signal of the corresponding loop unit.

10. The delta-sigma analog-digital converter of claim 1, wherein the plurality of feedback loop stages include a first loop unit through an m-th loop unit, where m is a natural number of two or more, the first loop unit through the m-th loop unit being connected in series so a previous loop unit generated loop signal is provided to a subsequent loop unit, and
   each of the first loop unit through the m-th loop unit performs the respective filtering of the fed back local error signals, and
   wherein the digital output signal is provided to the loop input signal generating unit for the feedback signal.

11. The delta-sigma analog-digital converter of claim 10, wherein each of the first loop unit through the m-th loop unit extracts the local error signals by respectively obtaining a difference between a resultant loop signal of each of the first loop unit through the m-th loop unit and the digital output signal.

12. The delta-sigma analog-digital converter of claim 10, wherein each of the first loop unit through the m-th loop unit includes a loop filter that performs the respective filtering of the fed back local error signals, and each of the first loop unit to (m−1)-th loop unit generates a resultant loop signal by summing a result of the respective filtering and a corresponding previous loop unit provided loop signal, and the m-th loop unit generates a corresponding resultant loop signal by summing a result of the respective filtering and the input loop signal.

13. The delta-sigma analog-digital converter of claim 12, wherein each of the loop filters is a digital finite impulse response filter including a plurality of digital delay elements, a plurality of digital multiplexers, and a plurality of digital adders.

14. The delta-sigma analog-digital converter of claim 10, wherein the loop input signal generating unit includes:
   a digital-analog converter configured to perform a digital to analog conversion of the digital output signal to generate the feedback signal;
   an analyzer configured to analyze the feedback signal and the analog input signal; and
   an analog quantizer configured to quantize a result of the analyzing to generate the loop input signal.

15. The delta-sigma analog-digital converter of claim 14, wherein the analyzing of the feedback signal and the analog input signal includes performing a summation with regard to the analog input signal and an analog signal based on the feedback signal.

16. The delta-sigma analog-digital converter of claim 10, wherein each of the first loop unit to the m-th loop unit includes:
   a subtractor configured to extract a corresponding local error signal by obtaining a difference between a resultant loop signal of a corresponding loop unit and the digital output signal;
   a loop filter filtering the corresponding local error signal; and
   an adder configured to sum a result of the filtering of the corresponding local error and a corresponding previous loop unit provided loop signal, to generate the resultant loop signal of the corresponding loop unit.

17. A delta-sigma analog-digital conversion method for generating a digital output signal from an analog input signal, comprising:
   generating a loop input signal based on both the analog input signal and a feedback signal that is based on the digital output signal;
   performing plural feedback loop operations that each include filtering of respective fed back local error signals that are respectively based on the digital output signal, to generate a loop output signal from the loop input signal with reduced noise over the loop input signal; and
   quantizing the loop output signal to generate the digital output signal.

18. The method of claim 17, wherein one of the plural feedback loop operations includes determining a difference between the digital output signal and the loop input signal, and the method further comprises generating the analog feedback signal by digital to analog converting a result of a filtering of the determined difference.

19. The method of claim 18, wherein another one of the plural feedback loop operations includes summing a loop output signal of a previous one of the plural feedback loop operations and a result of the filtering of the respective fed back local error signal.

20. The method of claim 17, wherein one of the plural feedback loop operations includes determining a difference between the digital output signal and a resultant loop signal generated by the one feedback loop operation, and the method further comprises generating the analog feedback signal by digital to analog converting the digital output signal.

* * * * *